United States Patent [19]
Guerin

[11] Patent Number: 5,784,396
[45] Date of Patent: Jul. 21, 1998

[54] VCSEL INTEGRAL FEEDBACK ASSEMBLY TWO-ETCH STRUCTURE

[75] Inventor: Jean-Michel Guerin, Glendale, Calif.

[73] Assignee: Xerox Corporation, Stamford, Conn.

[21] Appl. No.: 715,150

[22] Filed: Sep. 17, 1996

[51] Int. Cl.$^6$ ............... H01S 3/13; H01S 3/00; H01S 3/10; H01S 3/04

[52] U.S. Cl. ............... 372/29; 372/33; 372/24; 372/36; 372/75; 247/80

[58] Field of Search ............... 372/29, 33, 34, 372/36, 24, 50, 75, 96, 99, 109, 705, 45; 257/80, 81, 83, 84

[56] References Cited

U.S. PATENT DOCUMENTS

| | | | |
|---|---|---|---|
| 4,879,250 | 11/1989 | Chan | 257/80 |
| 5,163,063 | 11/1992 | Yoshikawa et al. | 372/38 |
| 5,226,053 | 7/1993 | Cho et al. | 372/96 |

*Primary Examiner*—Rodney B. Bovernick
*Assistant Examiner*—Quyen Phan Leung
*Attorney, Agent, or Firm*—Fariba Rad

[57] ABSTRACT

There is disclosed a vertical cavity laser diode (VCSEL) assembly with an integral set of detectors for the purpose of individually monitoring and adjusting the output power of each laser diode. A plate which has a plurality of light detectors and a plurality of apertures is bonded to a laser light source which has a plurality of VCSELs. Each aperture of the plate is aligned with a corresponding VCSEL and each light detector is electrically connected to a corresponding VCSEL.

5 Claims, 9 Drawing Sheets

VCSEL INTEGRAL FEEDBACK ASSEMBLY TWO-ETCH STRUCTURE

BACKGROUND OF THE INVENTION

This invention relates to a feedback system for a set of Vertical Cavity Surface Emitting Laser diode (VCSEL) assembly, and more particularly, to an integral structure which has an individual light detector for each laser diode of the set of VCSELs.

Typically, a single beam laser diode assembly has a single diode and usually, in a scanning system, the diode is connected to a train of image pixel information. The pixel information is used to drive the diode and therefore stimulate laser flux emission where there is a pixel. Ideally, in order to keep the light beam generated by the laser diode constant, the temperature of the diode should be kept at a constant level. However, due to the changing duty cycle of the train of image pixel information and also due to the environmental temperature variations, over time, the temperature of the diode increases which in turn causes the output power of the laser diode to decrease. The decrease in the output power will cause a decrease in the amount of discharge on the photoreceptor. This in turn will cause a decrease in the amount of toner attraction on the photoreceptor which will cause the shade of the image of a printed document to deviate from an intended shade.

In order to eliminate the deviation of the shade of the image, it is necessary to keep the output level of a laser diode at a certain level. It should be noted that in this specification, "image" shall mean both text and graphics.

In a set of laser diode assembly, there are multiple laser diodes each of which emits a single light beam and each light beam is modulated individually with a different train of pixel information. Multi-laser diodes are usually used in raster scanning systems to scan multiple lines simultaneously in an interlace format.

Figure 1:
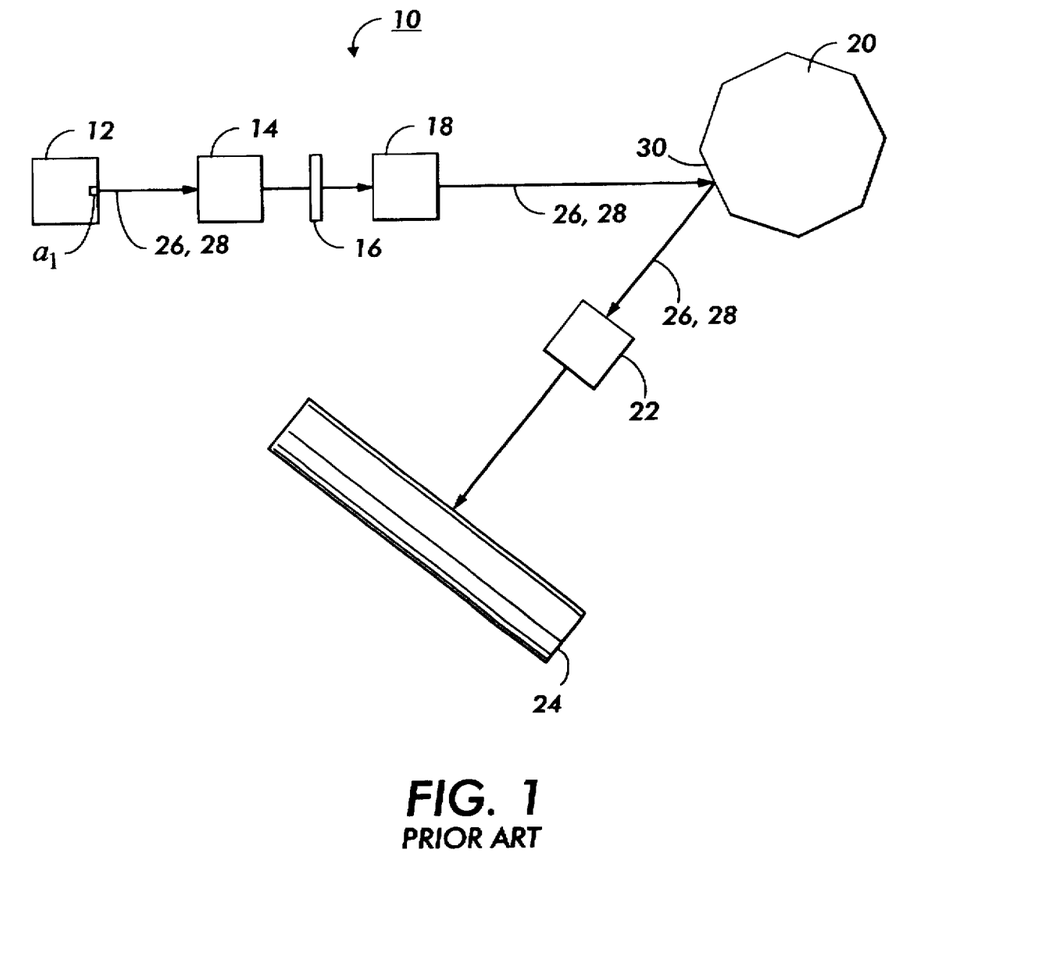
FIG. 1 shows a tangential (fast-scan) view of a prior art raster scanning system.
Figure 2:
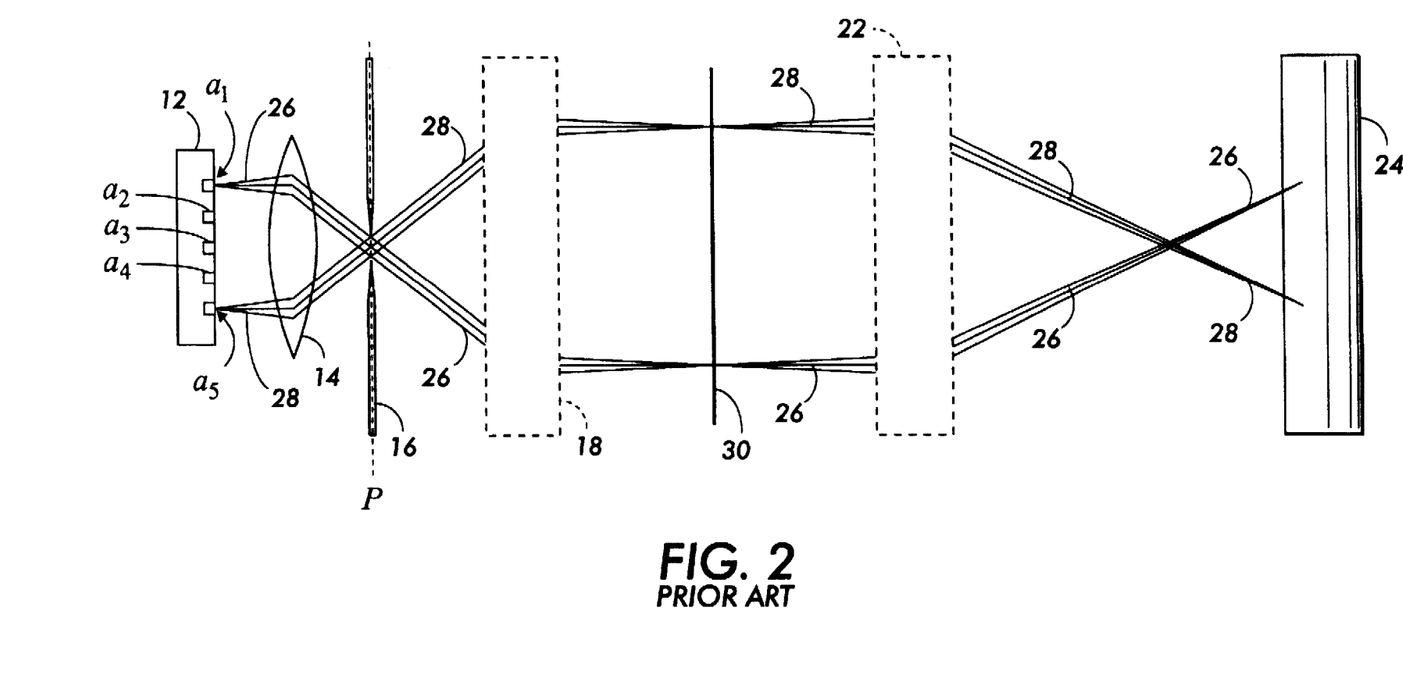
FIG. 2 shows a sagittal (cross-scan) view of the raster scanning system of FIG. 1.

Referring to FIG. 1, there is shown a tangential (fast-scan) view of a prior art multi-beam raster scanning system 10 and referring to FIG. 2, there is shown a sagittal (cross-scan) view of the raster scanning system 10 of FIG. 1. Referring to both FIGS. 1 and 2, raster scanning system 10 utilizes a multi-beam laser light source 12, a collimator 14, an aperture 16, pre-polygon optics 18, a multi-faceted rotating polygon mirror 20 as the scanning element, post polygon optics 22 and a photosensitive medium 24.

The laser light source 12 has multiple laser diodes $a_1$, $a_2$, $a_3$, $a_4$ and $a_5$. However, for the purpose of simplicity only the light beams from the laser diodes $a_1$ and $a_5$ are shown. Laser diode $a_1$ emits a light beam 26 and laser diode $a_5$ emits a light beam 28.

The rotating polygon mirror has a plurality of facets 30, each of which is a plane mirror. However in FIG. 2, for the purpose of simplicity, one of the facets 30 which is receiving the light beams, at a given time, is shown as line 30 and the light beams reflected by the facet 30 are unfolded.

The laser light source 12 sends the light beams 26 and 28 to the rotating polygon mirror 20 through the collimator 14, the aperture 16 and the pre-polygon optics 18. The collimator 14 collimates the light beams 26 and 28. The aperture 16 clips the light beams 26 and 28 as needed and the pre-polygon optics 18 focuses the light beams 26 and 28 in the sagittal or cross-scan plane onto the rotating polygon mirror 20.

The facets 30 of the rotating polygon mirror 20 reflect the light beams 26 and 28 and also cause the reflected light beams 26 and 28 to revolve about an axis near the reflection point of the facet 30. The reflected light beams 26 and 28 can be utilized through the post polygon optics 22 to scan a document at the input end of an imaging system as a raster input scanner or can be used to impinge upon a photographic film or a photosensitive medium 24, such as a xerographic drum (photoreceptor), at the output of the imaging system.

The rotating polygon mirror 20 scans both light beams 26 and 28 across the photoreceptor 24 simultaneously in an interlace format. The light beams 26 and a 28 start scanning the photoreceptor simultaneously with each light beam scanning an individual line.

Once the light beams 26 and 28 are used in an interlace format, if the output power of one light beam slightly differs from the other light beam, a phenomenon known as banding will appear on the printed document. In banding, the scan lines which are scanned by one light beam will be either darker or lighter than the scan lines which are scanned by the other light beam.

It is extremely important to keep the output power of all the laser diodes at a certain level to eliminate the banding problem. However, due to the tolerances of laser diodes, each laser diode reacts differently to the temperature and its output power changes differently based on the temperature change. As a result, each laser diode exposes the photoreceptor differently which creates the banding problem.

Since the banding problem is created as a result of difference between the output power of the diodes, it is necessary to adjust the output power of each laser diode individually.

It is an object of this invention to individually adjust the output power of each laser diode of a VCSEL set in order to sufficiently reduce the banding problem.

SUMMARY OF THE INVENTION

In accordance with the present invention, there is disclosed an integral feedback system for a set of vertical cavity laser diode (VCSEL) assembly. A plate, which has a plurality of light detectors and a plurality of apertures, is bounded to the VCSEL assembly of this invention in such a manner that each aperture aligns with a corresponding laser diode of the VCSEL assembly. The apertures allow the light beam form each laser diode to pass through a corresponding aperture. Each detector has an electrical connection to a corresponding one of the laser diodes of the VCSELs to provide a feedback for the purpose of adjusting the output power of its respective laser diode.

3

DETAILED DESCRIPTION OF THE INVENTION

Figure 3:
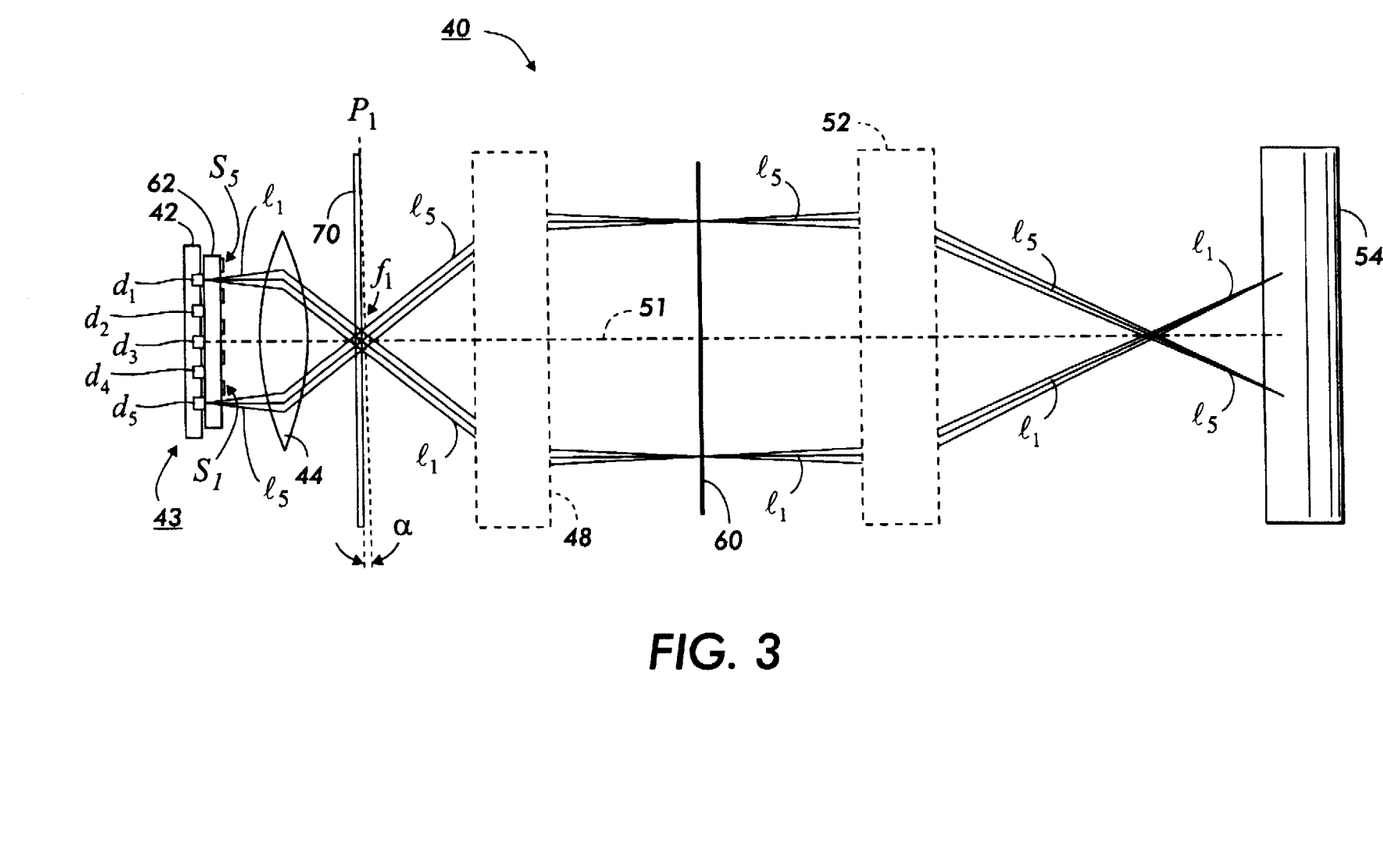
FIG. 3 shows a raster scanning system of this invention which is capable of monitoring the output power of each individual laser diode.

Referring to FIG. 3, there is shown a raster scanning system 40 of th is invention which is capable of monitoring the output power of each individual laser diode. In FIG. 3, the optical elements 44, 48, 60, 52 and 54 are the same and serve the same purpose as the optical elements 14, 18, 30, 22 and 24 of FIG. 2 respectively. The raster scanning system 40 utilizes a VCSEL light source 42.

Figure 4:
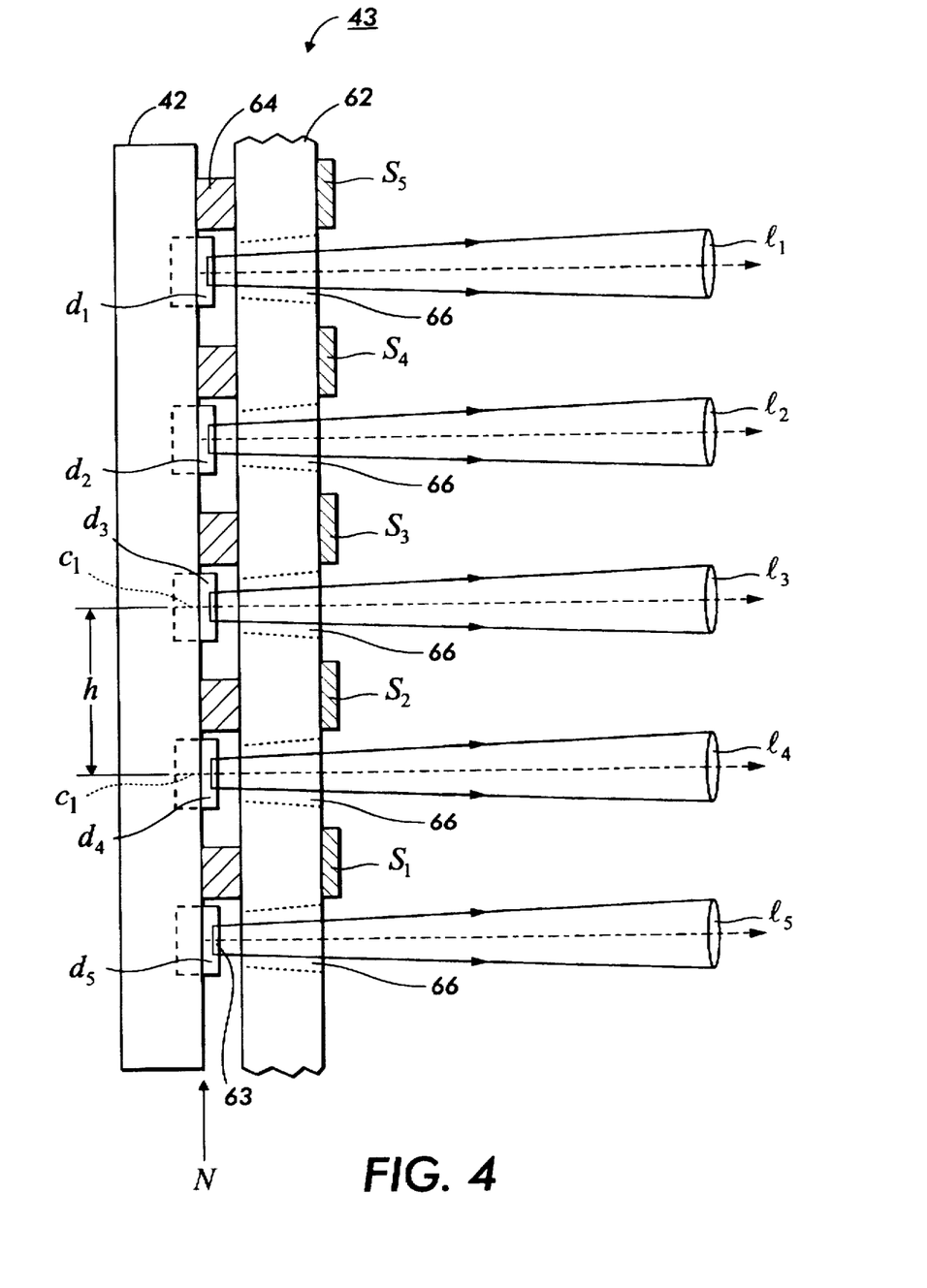
FIG. 4 shows a magnified cross sectional view of the VCSEL light source of FIG. 3.

Referring to FIG. 4, there is shown a magnified cross sectional view of the VCSEL light source 42. The VCSEL light source 42 has an array of diodes $d_1$, $d_2$, $d_3$, $d_4$ and $d_5$ each of which emits a light beam $l_1$, $l_2$, $l_3$, $l_4$ and $l_5$ respectively. Diodes $d_1$, $d_2$, $d_3$, $d_4$ and $d_5$ are exposed through the surface N. A plate 62 is mounted on the surface N. Bumps 64 of the surface N detaches the surface N from the plate 62. Plate 62 has apertures 66 which allow the light beams $l_1$, $l_2$, $l_3$, $l_4$ and $l_5$ to pass through the plate 62. Plate 62 also has an array of light detectors (light sensors) $S_1$, $S_2$, $S_3$, $S_4$, and $S_5$.

Figure 5:
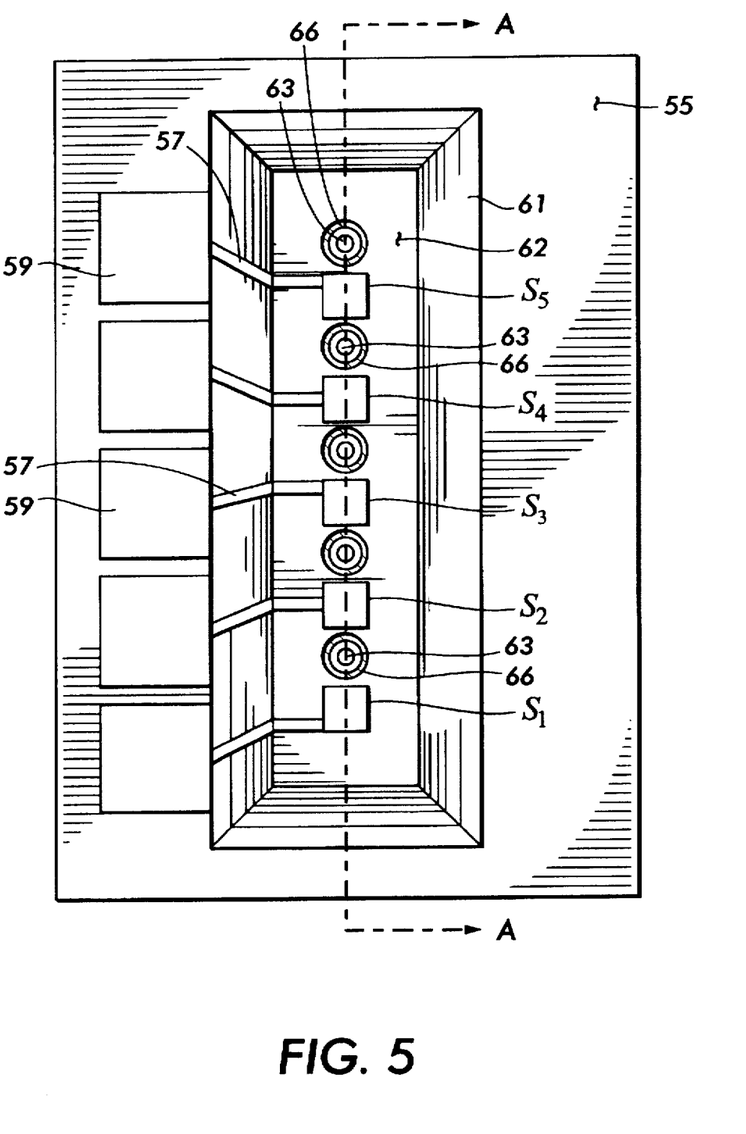
FIG. 5 shows a magnified top view of FIG. 4.
Figure 6:
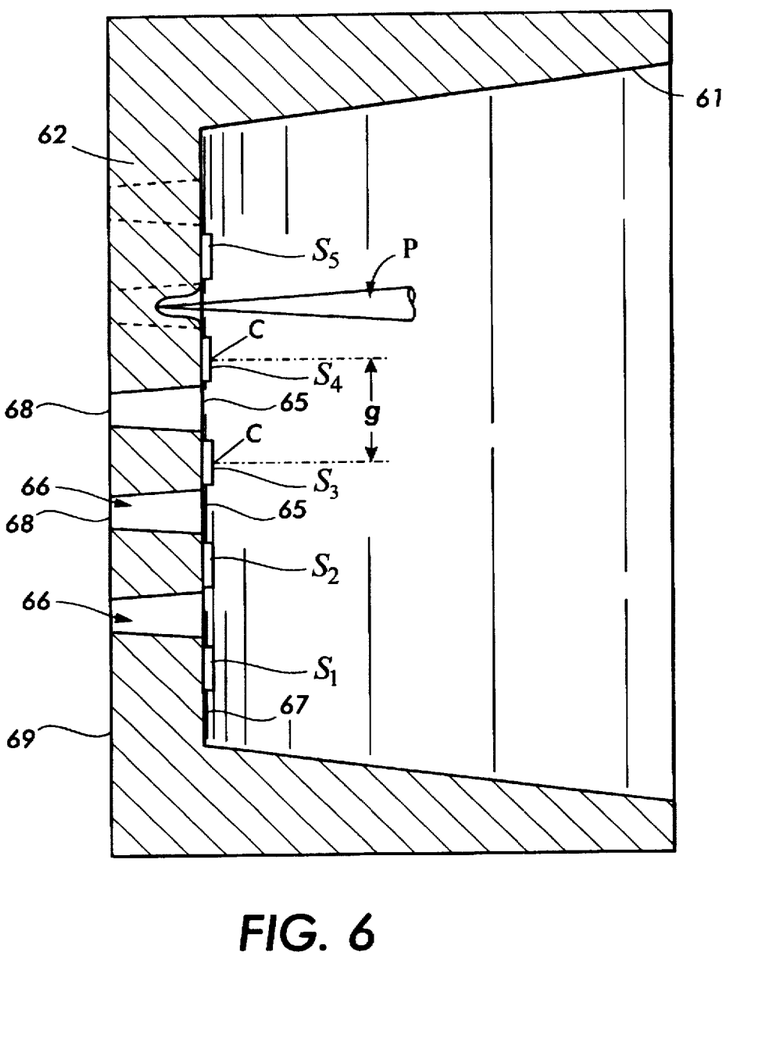
FIG. 6 shows a magnified cross sectional view of the plate 62 of FIG. 4 along line A—A.

Referring to FIG. 5, there is shown a magnified top view of the plate 62 and referring to FIG. 6, there is shown a cross sectional view of the plate 62 along line A—A of FIG. 5. Referring to both FIGS. 5 and 6, a plate 61 such as a silicon plate with a thickness, for instance 300 microns, is etched to create a thin plate 62, for instance 30 microns. After the plate 61 is etched, light detectors $S_1$, $S_2$, $S_3$, $S_4$, and $S_5$ are fabricated on plate 62 by well known micro electronics processes. The distance g between the centers C of each two adjacent light detectors (e.g. $S_3$ and $S_4$) is the same as the distance h between the centers $C_1$ of each two adjacent laser diodes (e.g. $d_3$ and $d_4$ of FIG. 4). The distance h between the diodes depends on the system design and on the function for which they are designed.

Referring to FIG. 5, Contacts 59 are located on surface 55. Contacts 59 provide connection to the circuitry (not shown) which control the light detector $S_1$, $S_2$, $S_3$, $S_4$, and $S_5$. The control circuitry also receive the generated signals from the light detectors $S_1$, $S_2$, $S_3$, $S_4$, and $S_5$. Lines 57 represent the connection between each light detector and its contact 59.

Referring to FIG. 6, after the light detectors $S_1$, $S_2$, $S_3$, $S_4$, and $S_5$ are fabricated, the apertures 66 have to be created in the plate 62. In the preferred embodiment of this invention, a laser light beam is used to create apertures 66 one by one. By striking a laser light beam such as the laser light beam P onto the plate 62 on an area such as the area between the light detectors $S_5$ and $S_4$, an aperture 66 will be etched in the plate 62. Each aperture 66 is located between two adjacent light detectors.

It should be noted that the apertures 66 and the light detectors $S_1$, $S_2$, $S_3$, $S_4$, and $S_5$ can be created to be on one line, as shown in FIG. 5, or can be created to be offset with respect to each other. However, regardless of being on one line or offset, they have to be created in such a manner to form a pattern which has alternating apertures and light detectors. Furthermore, the pattern of the apertures as a stand alone pattern has to match the pattern of laser diodes and the pattern of the light detectors as a stand alone pattern also has to match the pattern of the laser diodes.

4

Due to the nature of the etching process via laser light beam, the apertures 66 have a conical shape in which the opening 65 on the surface 67 is larger than the opening 68 on the surface 69. In this invention, the opening 68 is selected to be slightly smaller than the size of each laser diode $d_1$, $d_2$, $d_3$, $d_4$ and $d_5$ of FIG. 4. However, the opening 68 has to be larger than the emitting area (shown as 63 in FIG. 4) of each laser diode $d_1$, $d_2$, $d_3$, $d_4$ and $d_5$.

Once the apertures 66 are created, referring back to FIG. 4, the plate 62 will be bonded to the VCSEL light source 42 which is a well known light source in the industry. The plate 62 will be bonded to the light source 42 by a well known method called flip chip bonding. Prior to bonding of the plate 62 to the light source 42, each apertures 66 has to be aligned with a corresponding one of the laser diodes $d_1$, $d_2$, $d_3$, $d_4$, and $d_5$. The bumps 64 are created through the bonding process.

It should be noted that any method which can create the apertures 66 can replace the laser light beam used in this invention and any method which can bond the plate 62 to the light source 42 can replace the flip chip bonding used in this invention.

Referring back to FIG. 3, for the purpose of simplicity, only the light beams $l_1$ and $l_5$ from the laser diodes $d_1$ and $d_5$ are shown. The light beams $l_1$ and $l_5$ along with the other light beams which are not shown pass through the collimator 44 and cross each other on the image plane $P_1$ of the collimator 44.

It should be noted that when the light beams $l_1$ and $l_5$ and the other light beams cross each other on plane $P_1$, the central rays of all light beams $l_1$ and $l_5$ cross each other at point $f_1$ which is the focal point of the collimator 44.

A semi transparent and semi-reflective plate 70 is placed in the general area of plane $P_1$ in such a manner that it has an angle α with respect to the plane $P_1$. The image plane P1 is a plane which is orthogonal to the optical axis 51 of the raster scanning system 40. Plate 70 allows a portion of each light beam to pass through while reflecting the remaining portion of each light beam. In the preferred embodiment of this invention, plate 70 is selected to allow about 95% of the light beam to pass through. Plate 70 can be partially coated to clip the light beam in the same manner as the aperture 16 of FIG. 2.

It should be noted that as an alternative, instead of coating the plate 70, a separate aperture can be placed in the raster scanning system 40 to clip the light beams.

Figure 7:
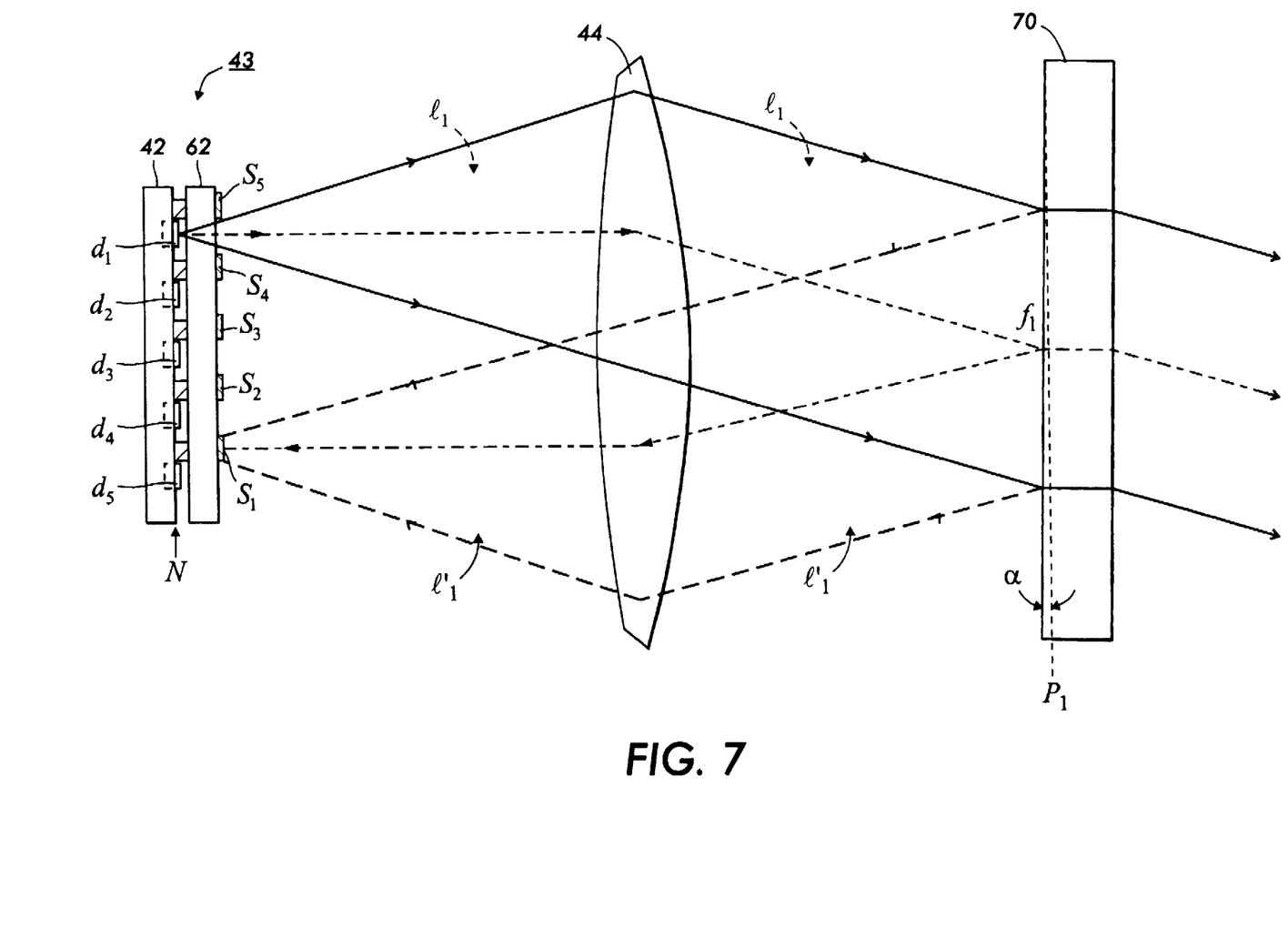
FIG. 7 shows a magnified portion of FIG. 3 in which only the path of the light beam from the laser diode $d_1$ and the path of the same light beam after it is reflected are shown.

Referring to FIG. 7, there is shown a magnified partial view of FIG. 3 which shows the light source 42, the collimator 44 and the plate 70. FIG. 7 shows only the path of the light beam $l_1$ and the reflected light beam $l_1'$. Once the light beam $l_1$ from the laser diode $d_1$ strikes the plate 70, a portion of it will pass through the plate 70 and a portion of it will be reflected back as the light beam $l_1'$. Due to the angle α of plate 70, the reflected light beam $l_1'$ will be directed toward the light detector $S_1$. The reflected light beam $l_1'$ will pass through the collimator 44 and focuses on the laser surface N. The detector $S_1$ is located in the path of the reflected light beam $l_1'$. The detector $S_1$ receives the reflected light beam $l_1'$ which is substantially focused.

Once the detector $S_1$, receives the reflected light beam $l_1'$, it generates a signal which in a well known manner will be sent to a comparator to be compared with a reference level and the result will be used in a well known manner to modify the output power of the laser diode $d_1$.

Figure 8:
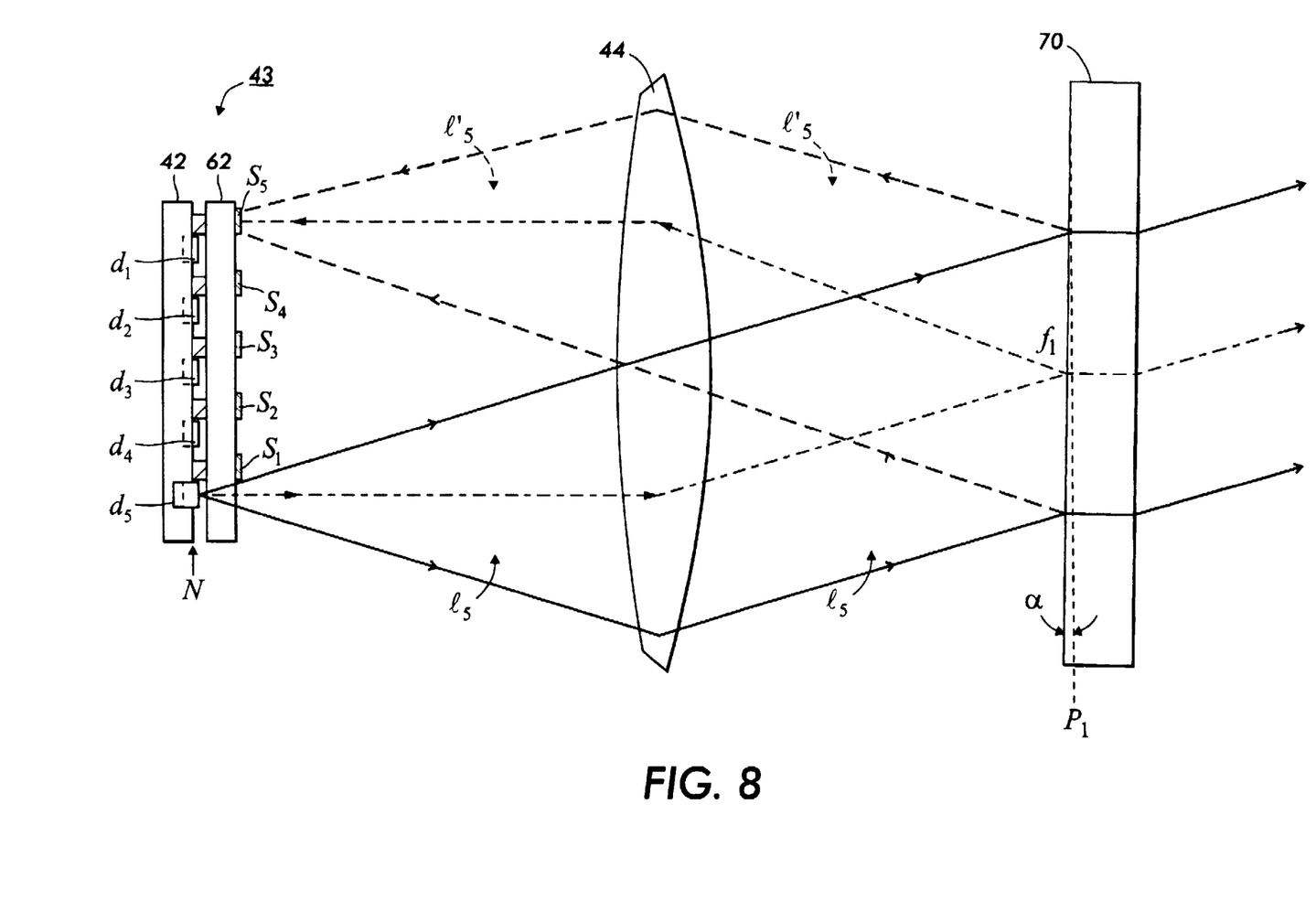
FIG. 8 shows a magnified portion of FIG. 3 in which only the path of the light beam from the laser diode $d_5$ and the path of the same light beam after it is reflected are shown.

Referring to FIG. 8, there is shown a magnified partial view of FIG. 3 which shows the light source 42, the collimator 44 and the plate 70 with the light beam from the laser diode $d_5$. FIG. 8 shows only the path of the light beam to and the reflected light beam $l_5'$. Once the light beam $l_5$ from the laser diode $d_5$ strikes the plate 70, a portion of it will pass through the plate 70 and a portion of it will be reflected back as the light beam $l_5'$. The reflected light beam $l_5$ passes through the collimator 44 and focuses on the plane N. Detector $S_5$ is located in the path of the reflected light beam $l_5'$. Detector $S_5$ receives the substantially focused reflected light beam $l_5'$ and generates a signal to modify the output power of the laser diode $d_5$.

In the same manner, there is one detector for the reflected light beam of each individual laser diode. Detectors $S_2$, $S_3$ and $S_4$ detect the light beam from the laser diodes $d_2$, $d_3$ and $d_4$ respectively.

Figure 9:
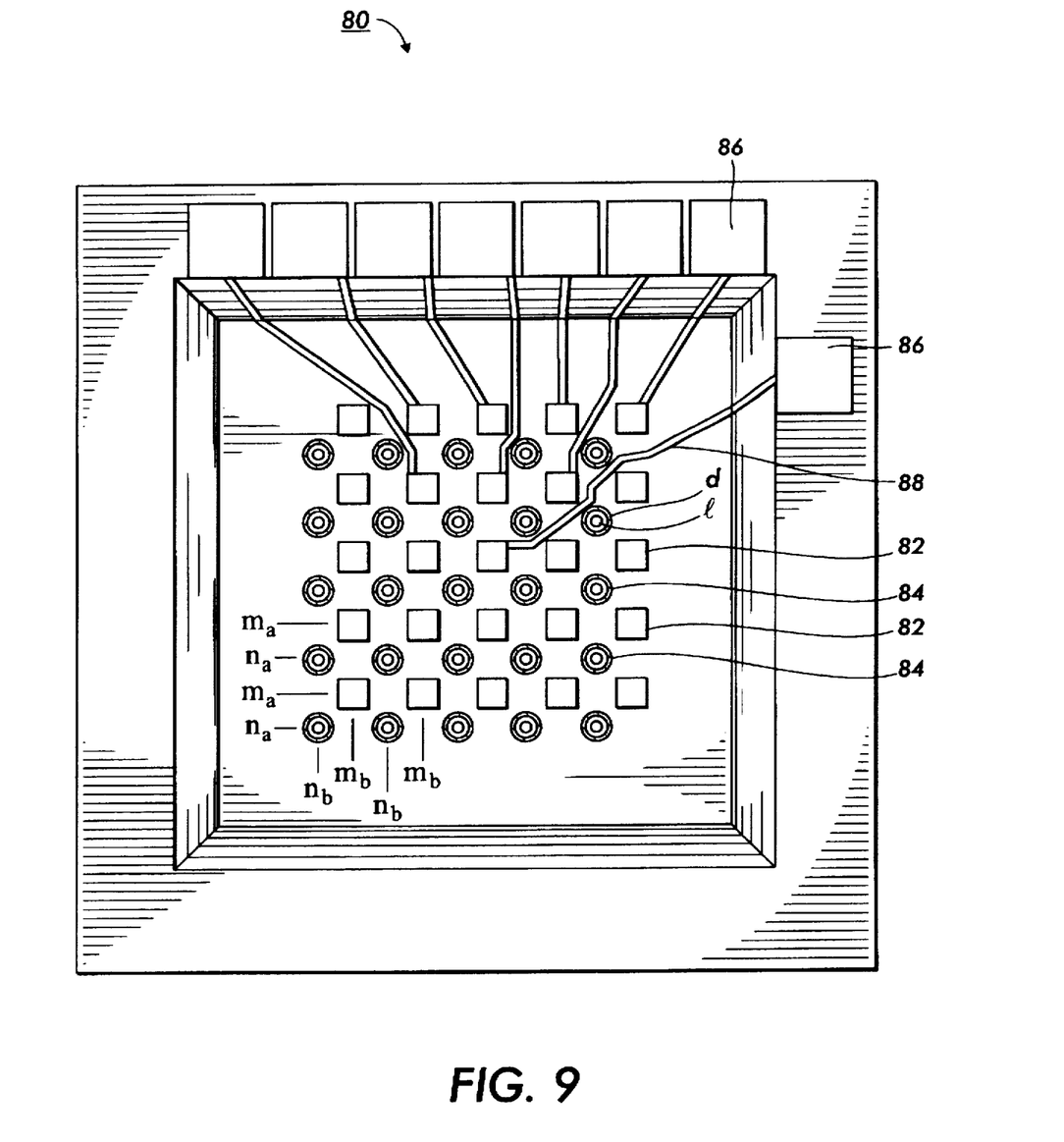
FIG. 9 shows a top view of a two dimensional array of the VCSEL integral feedback assembly of this invention.

The light detectors of this invention can also be utilized for two dimensional arrays of VCSEL. Referring to FIG. 9, there is shown a top view of a plate 80 which has a two dimensional array of light detectors 82. The plate 80 is bounded to a two dimensional array of VCSELs which is located under the plate 80. Each laser diode d of the VCSELs is under a corresponding aperture 84.

The light detectors 82 and the apertures 84 form a matrix and are located in an alternating manner. The light detectors 82 form rows $n_a$ and columns $n_b$. In the same manner, apertures 84 form rows $m_a$ and columns $m_b$. For the purpose of simplicity, only a limited number of rows and columns of the light detectors 82 and the apertures 84 are labeled. Columns $n_b$ of light detectors and columns $m_b$ of apertures are located in an alternating manner. Also, rows $n_a$ of light detecting means and rows $m_a$ of apertures are located in an alternating manner.

In FIG. 9, the circles 1 represent the light beam being generated by the laser diodes d which only a portion of them (white circles around the black circles) are visible through the apertures 84. Contacts 86 provide connection to the circuitry which control the light detectors 82 and receive the generated signals from the light detectors 82. Lines 88 represent the connection between each light detector 82 and its contact 86. For the purpose of simplicity, only a limited number of the contacts 86 and the connections 88 are shown.

It should further be noted that numerous changes in details of construction and the combination and arrangement of elements and materials may be resorted to without departing from the true spirit and scope of the invention as hereinafter claimed.

I claim:

1. A vertical cavity surface emitting laser diode integral feedback assembly comprising:

a plate having a first surface, a second surface and a thickness located between said first and said second surfaces;

said plate having a plurality of light detecting means on said first surface and a plurality of openings extending entirely through said thickness;

a laser light source having a plurality of vertical cavity surface emitting laser diodes for emitting a plurality of light beams;

said plate being spaced apart from and being operably connected to said light source in such a manner that each one of said plurality of openings of said plate aligns with a corresponding one of said plurality of vertical cavity surface emitting laser diodes in order to allow the light beam from each one of said plurality of vertical cavity surface emitting laser diodes to pass through a corresponding one of said plurality of openings;

each one of said plurality of light detecting means being electrically connected to a corresponding one of said plurality of vertical cavity surface emitting laser diodes to provide a feedback to each individual vertical cavity surface emitting laser diode.

2. The vertical cavity surface emitting laser diode integral feedback assembly recited in claim 1, wherein said plurality of light detecting means form a plurality of first rows and a plurality of first columns and said plurality of openings form a plurality of second rows and a plurality of second columns.

3. The vertical cavity surface emitting laser diode integral feedback assembly recited in claim 2, wherein said plurality of first rows and said plurality of second rows are located in an alternating manner.

4. The vertical cavity surface emitting laser diode integral feedback assembly recited in claim 2, wherein said plurality of first columns and said plurality of second columns are located in an alternating manner.

5. The vertical cavity surface emitting laser diode integral feedback assembly recited in claim 2, wherein said plurality of first rows and said plurality of second rows are located in an alternating manner and said plurality of first columns and said plurality of second columns are located in an alternating manner.

* * * * *